United States Patent
Wallis et al.

(10) Patent No.: US 6,820,495 B2
(45) Date of Patent: Nov. 23, 2004

(54) STRAIN/ELECTRICAL POTENTIAL TRANSDUCER

(75) Inventors: Jeremy Rex Wallis, Pretoria (ZA); Philip Wayne Loveday, Midrand (ZA)

(73) Assignee: CSIR (ZA)

( * ) Notice: Subject to any disclaimer, the term of this patent is extended or adjusted under 35 U.S.C. 154(b) by 0 days.

(21) Appl. No.: 10/432,201

(22) PCT Filed: Nov. 20, 2001

(86) PCT No.: PCT/IB01/02182
§ 371 (c)(1),
(2), (4) Date: Sep. 15, 2003

(87) PCT Pub. No.: WO02/43163
PCT Pub. Date: May 30, 2002

(65) Prior Publication Data
US 2004/0027780 A1 Feb. 12, 2004

(30) Foreign Application Priority Data
Nov. 21, 2000 (ZA) .......................... 2000/6812

(51) Int. Cl.[7] .............................................. G01B 7/16
(52) U.S. Cl. ....................................................... 73/782
(58) Field of Search ...................... 73/777, 782, 862.31, 73/862.632, 862.633, 862.634

(56) References Cited

U.S. PATENT DOCUMENTS

| | | | | |
|---|---|---|---|---|
| 3,748,623 A | * | 7/1973 | Millar | .......................... 338/4 |
| 4,093,883 A | * | 6/1978 | Yamamoto | ................... 310/317 |
| 5,367,217 A | * | 11/1994 | Norling | ....................... 310/370 |
| 5,903,085 A | | 5/1999 | Karam | |
| 6,134,964 A | * | 10/2000 | Jaenker et al. | ........... 73/514.21 |

FOREIGN PATENT DOCUMENTS

| | | |
|---|---|---|
| DE | 19742205 | 3/1998 |
| JP | 5-304323 | 11/1993 |
| WO | WO 99/67683 | 12/1999 |

* cited by examiner

*Primary Examiner*—Max Noori
(74) *Attorney, Agent, or Firm*—Dean W. Russell; Kilpatrick Stockton LLP

(57) ABSTRACT

A strain/electrical potential transducer (10) includes a rigid base (12), a rigid beam (18) hinged to the base (12) at (20), an elongate stack (14) of dielectric substance, e.g. piezoelectric material, generally parallel with the beam (18) and hinged to the base at (16), and a rigid link (22) interconnecting ends of the beam and stack remote from the base (12). The transducer can be operated as a displacement generator by applying potential difference to the stack (14) via contacts (15) to strain the stack (14) and to cause amplified, transverse displacement as shown at (32). Conversely, the transducer can be operated as a sensor. Displacement at (32) causes strain in the stack (14) which generates a potential difference at the contacts (15). Composite transducers are disclosed. A manipulating device in the form of an arrangement of displacement generators and use thereof for microscanning are disclosed.

29 Claims, 3 Drawing Sheets

STRAIN/ELECTRICAL POTENTIAL TRANSDUCER

CROSS REFERENCE TO RELATED APPLICATIONS

This application claims priority to South African Application No. 2000/6812 filed on Nov. 21, 2000 and is the U.S. national phase of International Application No. PCT/IB01/02182 filed on Nov 20, 2001 published in English as International Publication No. WO 02/43163 A2 on May 30, 2002, the entire contents of which are hereby incorporated by reference.

THIS INVENTION relates to a strain/electrical potential transducer. It relates to generating displacement by means of converse piezoelectric effect or electrostriction. It relates more specifically to a displacement generator, to a manipulating device and to a microscanning device. It relates also to sensing displacement by means of direct piezoelectric effect.

The Applicant believes that one species of this invention can particularly advantageously be worked by means of converse piezoelectric effect, and that application will predominantly be borne in mind for purposes of this specification. However, the Applicant does not wish to exclude similar ways of obtaining small displacement by applying a changing electrical potential to a dielectric material, such as electrostriction, and such applications, where appropriate, are included within the scope of this invention. For convenience, the phrase "electro-deformation of dielectric substance" or similar phrases, will to a limited extent be used in this specification and the phrase is or the phrases are to be interpreted to denote converse piezoelectric effect, electrostriction and similar phenomena.

Furthermore, in another species of this invention a transducer is used as a sensor by making use of direct piezoelectric effect. By subjecting the transducer to displacement under force causing stress, electrical potential is generated signalling the presence of stress and thus displacement under force. As a variant, in so far as strain relates to stress or force, the transducer can be used to sense stress or force. Sensing stress or force will be regarded, for purposes of this specification, as equivalent to sensing displacement. Such applications fall within the scope of this invention, and this specification covers also such "reverse" applications.

In accordance with a first aspect of this invention, there is provided a strain/electrical potential transducer including
  a rigid base,
  an elongate stack of dielectric substance having electrical contactors arranged to be subjected to an electric potential associated with electro-deformation of the dielectric substance, a first end of the elongate stack being hinged to the base at a stack hinge position;
  a rigid beam hinged at a first end thereof to the base at a beam hinge position, the rigid beam being transversely spaced from the elongate stack and extending generally longitudinally with the elongate stack;
  a rigid connecting link extending transversely between and interconnecting opposed ends respectively of the elongate stack opposite to said first, hinged end, and of the rigid beam opposite to said first, hinged end, the configuration being such that longitudinal deformation in the elongate stack and transverse displacement in said opposed end of the rigid beam are causally connected.

The elongate stack may preferably be of piezoelectric material.

The transducer may be arranged in a plane.

Hinging may advantageously be by means of solid hinge formations allowing hinging. The solid hinge formations may be of a material having high fatigue strength, such as titanium.

Instead, the hinges may be articulated. They may, for example, use ball joints, however, it is regarded as important that the hinges should provide no or very little lost motion.

Preferably, connection of the rigid connecting link to respectively the elongate stock and the rigid beam is with no lost motion.

By way of development, the transducer may be of composite structure, said elongate stack and said rigid connecting link being respectively a first elongate stack and a first connecting link, the transducer including also a second elongate stack and a second rigid connecting link arranged in a fashion similar to and connected in a fashion similar to the first elongate stack and the first connecting link; Thus the transducer may include a first sub-arrangement comprising the first elongate stack and the first rigid connecting link, and a second sub-arrangement comprising the second elongate stack and the second rigid connecting link, the first and second sub-arrangements being symmetric and sharing the rigid beam which is common to the first and second sub-arrangements. The sub-arrangements may be mirror images.

Advantageously, the rigid beam may be placed under tension to compress the first and second elongate stacks, such that, in use, tension in the elongate stacks is obviated or at least limited. Thus, the elongate stacks will operate in compression or mostly in compression.

In one species of embodiment, the transducer may be in the form of a displacement generator. Then, the or each elongate stack may be a piezoelectric material adapted to produce a converse piezoelectric effect.

In another species of embodiment, the transducer may be in the form of a displacement sensor. The or each elongate stack may be a piezoelectric material adapter to produce direct piezoelectric effect.

The invention extends to a composite strain/electrical potential transducer comprising a plurality of transducers which are combined to have a single displacement input/output and a single electrical potential input/output.

In accordance with a second aspect of this invention, there is provided a manipulating device for use in an optical system, the manipulating device including
  a frame for holding an optical element;
  a plurality of transducers in the form of displacement generators as herein described and which are operatively connected to the frame and having connecting means for operative connection to an anchor member such as selectively to generate displacement of the frame relative to the anchor member.

Bases of the respective displacement generators may be connected to the anchor member. In practice, the anchor member may form bases for the displacement generators, the second end of the rigid beam of each displacement generator being connected to the frame.

The displacement generators may be arranged symmetrically. They may advantageously be two, three or four in number. They may be arranged in a plane.

The frame may be round, the displacement generators extending radially outwardly from the frame.

The displacement generators may be arranged such that said relative displacement between the frame and each displacement generator is in a longitudinal direction relative to an axis of the optical element to be held in the frame.

In a preferred embodiment, the displacement generators may be even in number and may be arranged in opposed pairs, the displacement generators in each opposed pair being in the same orientation and in opposite orientation to another opposed pair, the displacement generators being prestressed to cause the displacement generators to operate in compression or at least mostly in compression, the prestressing load in one pair of displacement generators being balanced by the prestressing load in the other pair of displacement generators, the prestressing loads being transmitted to the frame, the frame or the frame in combination with the optical element when in position, then being rigid such as to balance the prestressing loads.

The second aspect of this invention extends to a combination of a manipulating device as herein described in combination with a generator of electrical potential which is controllable selectively to generate fluctuating potential difference to drive the stacks. The generator of electrical potential may be a solid state generator having a plurality of outputs corresponding to the plurality of displacement generators or pairs of displacement generators, the combination including software or logic to manage or control the generator of electrical potential.

The invention extends in respect of a third aspect to a microscanning device including an optical receiver, an optical system directed at the optical receiver and a manipulating de/ice as herein described and in which an optical element is held in the frame to form part of the optical system, the manipulating device being operable selectively and fluctuatingly to refract optical beams projected via the optical system to effect microscanning.

The invention is now described by way of example with reference to the accompanying diagrammatic drawings. In the drawings FIG. 1 shows, in side view, schematically, a strain/electric potential transducer in accordance with the invention;

Figure 1:
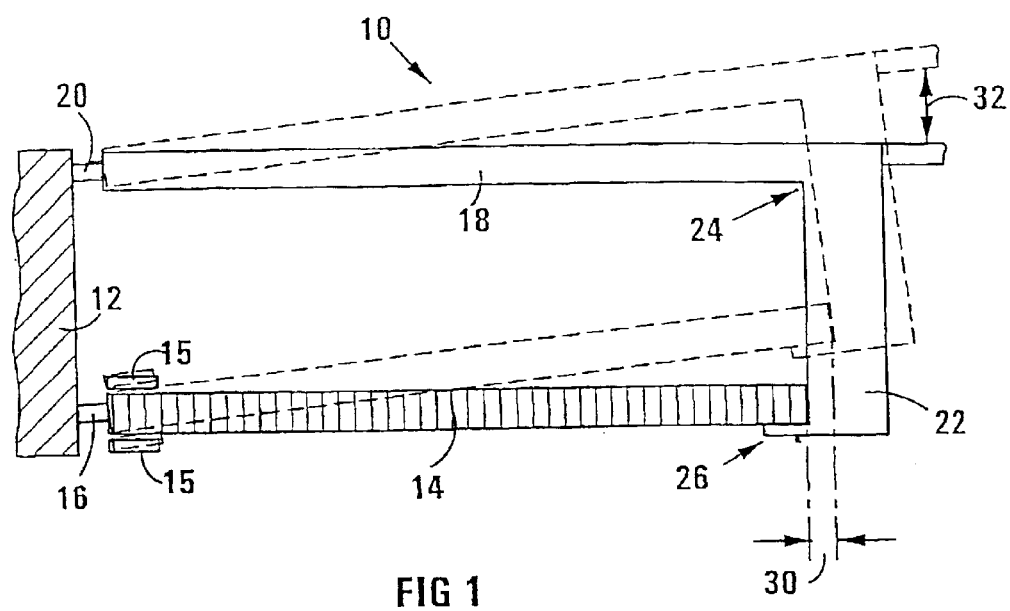

With reference to FIG. 1, a strain/electrical potential transducer in accordance with the invention is generally indicated by reference numeral 10.

The transducer 10 comprises a base 12, shown fragmentarily and in section. The base 12 is rigid.

Piezoelectric material in the form of an elongate stack, generally indicated by reference numeral 14, is hinged at one end thereof by means of a solid hinge 16 to the base 12. The solid hinge is, for example, of titanium which has very good fatigue characteristics. Electrical contactors or contact points 15 are applied to the stack 14 to connect electrical conductors to the stack 14; selectively longitudinally to deform the stack when the transducer is operated as a displacement generator in accordance with converse piezoelectric effect; and for connection to a potential meter or voltmeter when the transducer is operated as a sensor to sense displacement.

The transducer 10 further includes a rigid beam 18 transversely spaced from and generally parallel to the elongate stack 14. The rigid beam 18 is also of a length corresponding to the length of the stack 14. One end of the rigid beam 18 is mounted by means of a solid, titanium hinge 20 to the base 12.

The transducer 10 yet further comprises a transverse rigid link 22. In this embodiment, the rigid link 22 is integral with the beam 18 at an end of the beam 18 opposed to the solid hinge 20. The rigid link 22 is rigidly connected to the rigid beam 18 via an elbow indicated by reference numeral 24.

An end of the stack 14 opposed to the solid hinge 16 is connected to a free end of the rigid link 22 as indicated by reference numeral 26. The connection at 26 is solid or quasi-solid.

In accordance with this invention, elongation of the stack 14 through a small distance indicated by reference numeral 30 will, on account of the hinge effect of the hinges 16, 20 and the rigid character of the beam 18, the rigid link 22 and the rigid, integral connection 24, cause relatively large displacement of the end of the beam 18 at the integral connection 24 as indicated by reference numeral 32. This is shown schematically, in exaggerated form, in dotted outlines, in FIG. 1. It is to be appreciated that the displacement 32 is transverse to, substantially perpendicular to, the elongation 30 and that the displacement 32 is generally an order of magnitude larger than the elongation 30. It is to be appreciated that the ratio of the displacements respectively at 32 and 30, can be selected, inter alia, by selecting the spacing between the beam 18 and the stack 14—the closer the spacing the larger the ratio.

Thus, in accordance with the invention, if the transducer is operated as a displacement generator, small elongation of the piezoelectric stack 14 causes large displacement, in a transverse direction, of a point on the displacement generator 10. It is yet further to be appreciated that contraction of the stack 14 will cause displacement in the same fashion, but in an opposite direction, as will easily be appreciated by a person skilled in this art.

It is yet further to be appreciated that elongation and contraction of the stack 14 can easily and very quickly be effected by controlling the application of potential difference to the contacts 15, for example by means of a solid state electrical potential generator which is controlled, for example, by means of programmed logic, software, or the like.

Likewise, if the transducer 10 is operated as a displacement sensor, a relatively large displacement at the position 24 strains the stack 14 and causes a measurable potential difference over the contacts 15.

Figure 2:
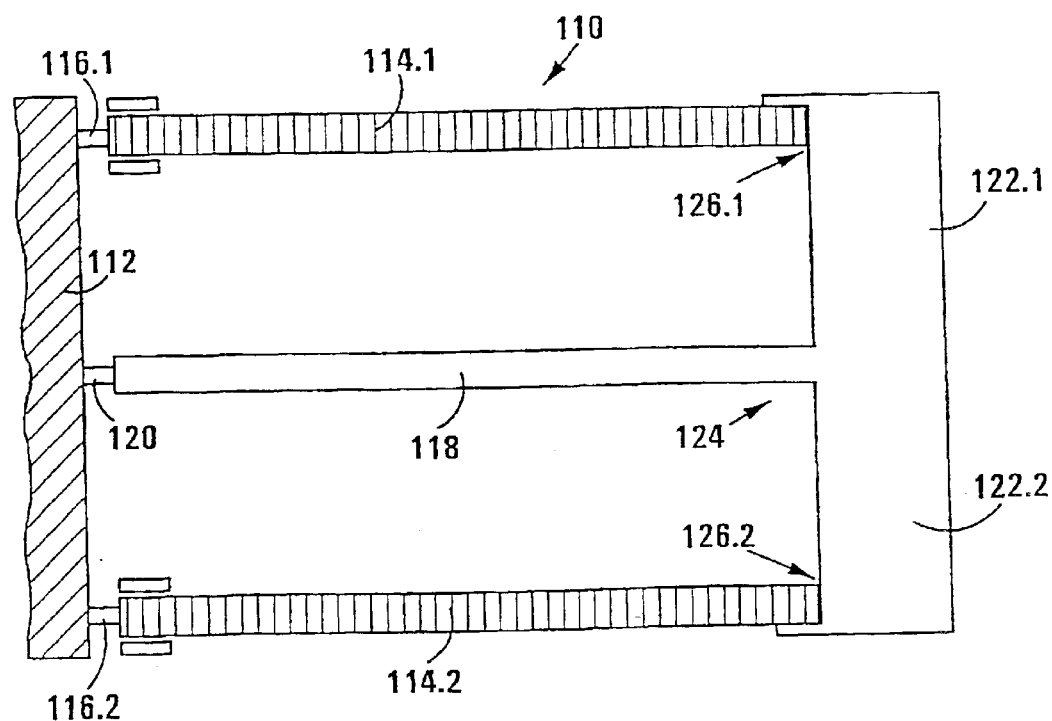
FIG. 2 shows, in a view similar to that of FIG. 1, a composite strain/electrical potential transducer in accordance with the invention.

With reference to FIG. 2, by way of development, instead of having the rigid beam 18 and the rigid link 22 in the form of an "L" such as in the device 10 of FIG. 1, a single rigid beam 118 can have an integral pair of rigid links 122.1, 122.2 such that the configuration is in the form of a "T". The transducer 110 can then have a symmetrical pair of elongate stacks 114.1 and 114.2 connected to opposed ends of the transverse "T"-limb.

It is proposed that the rigid beam 118 be placed under tension to compress the elongate stacks 114.1 and 114.2 to cause the elongate stacks to operate exclusively in compression, or mostly in compression. The advantage of this is that it is regarded as advantageous for piezoelectric material in general not to be under tension or under severe tension, but preferably under compression.

Figure 3:
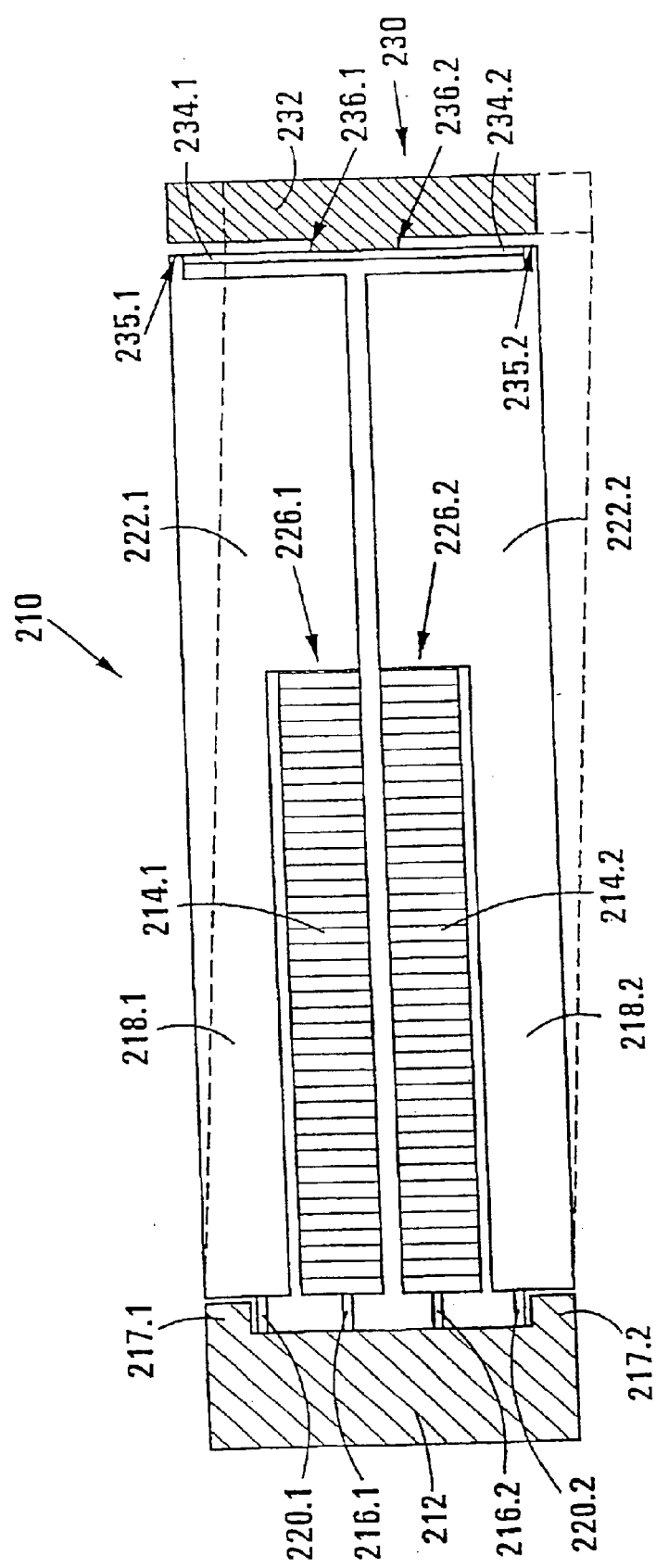
FIG. 3 shows, in a view corresponding to FIG. 2, a development of the transducer of FIG. 2.

With reference to FIG. 3, a further embodiment of a transducer in accordance with the invention is generally indicated by reference numeral 210. It is in many respects similar to the embodiment of FIGS. 1 and 2, and like reference numerals are used to denote like features or like components. The transducer 210 is not described in detail and differences and important features are emphasized.

The transducer 210 is a composite transducer comprising two mirror imaged portions about a longitudinal centre line which is not shown in the drawing. Because it is symmetric, the beams 218.1 and 218.2 may be placed in tension to ensure that the stacks 214.1 and 214.2 of piezoelectric material operate in compression or mostly in compression.

The base 212 and beams 218.1, 218.2 as well as the rigid links 222.1 and 222.2 are cut out from solid titanium material. Thus, also the solid hinges 220.1, 220.2 and 216.1 and 216.2 are of the same mother material. Advantageously, between one end of the base 212 and its adjacent beam 218.1, in the vicinity of the solid hinge 220.1, an abutting projection 217.1 is formed projecting from the base 212 to a position shy of the proximate end of the beam 218.1 by a predetermined amount. A mirror imaged identical abutting formation 217.2 is provided at an opposed end of the rigid beam 212 projecting toward the proximate end of the beam 218.2. The advantage of these abutting projections is that they limit the degree of hinging (in respectively opposite directions) at the respective solid hinges 220.1, 220.2 and thus also the amount of deformation possible. They then act as limiting devices ensuring that the transducer 210 will operate within acceptable limits.

The most important feature of the device 210 is that it includes an active end portion generally indicated by reference numeral 230. The end portion 230 includes an end beam 232 which extends transversely across the width or the height of the transducer 210. At one side of the beam 232, along a central portion thereof, it is connected to a flexible link 234.1 extending alongside said one side of the beam 232. Toward the opposed end there is correspondingly provided a flexible link 234.2 in alignment with the link 234.1. Outer ends of the flexible links 234.1 and 234.2, are connected as indicated respectively by 235.1 and 235.2 to corners of the respective rigid links 222.1 and 222.2. It is to be appreciated that the flexible links 234.1, 234.2 are flexible in bending with little resistance, but that they provide substantial resistance to elongation. Thus, when the transducer 210 is operated as shown in dotted outlines in FIG. 3, either to measure strain in a transverse direction or to generate displacement in a transverse direction, the beam 232 virtually exclusively translates and does not rotate. This is achieved by preselecting the positions of attachment of the flexible links to the beam 232.

Figure 4:
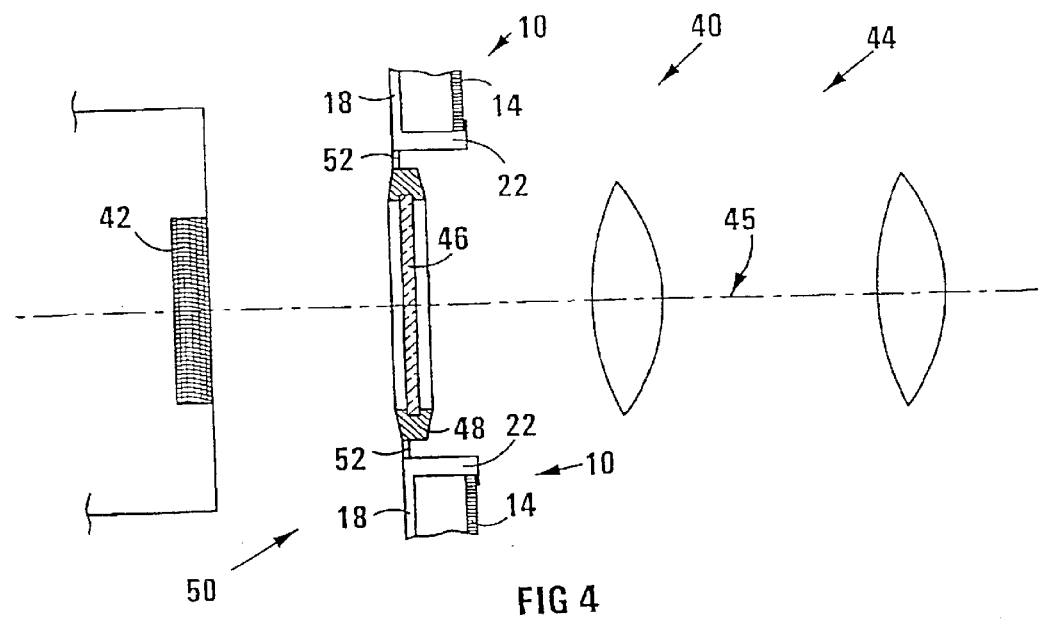
FIG. 4 shows, schematically, in side view, a microscanning device in accordance with the invention.

With reference to FIG. 4, a microscanning arrangement is shown schematically, generally indicated by reference numeral 40.

The microscanning arrangement 40 includes a receiver 42 having a pixel matrix. It further includes an optical system generally indicated by reference numeral 44 having an axis and by means of which optical beams are projected onto the receiver 42. As part of the optical system 44, there is provided an optical window 46 of an appropriate optical material. For example in the case of infra red beams, the window 46 may, advantageously, be of Germanium. The optical window 46 is held in a frame 48. In this embodiment, the optical window 46 and the frame 48 are round. In other embodiments, the window and the frame may be other than round. The optical window 46 and frame 48 form part of a manipulating device in accordance with the invention and which is generally indicated by reference numeral 50 in FIG. 4. The optical system 44, and the manipulating device 50, in this embodiment, are symmetric about the longitudinal optical axis 45.

Figure 5:
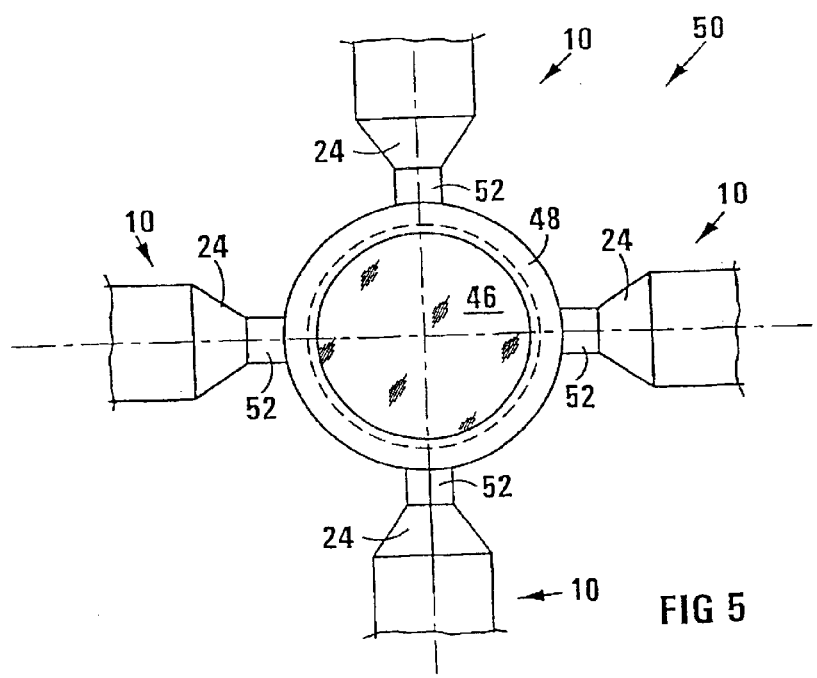
FIG. 5 shows, in axial view, fragmentarily a manipulating device in accordance with the invention.

The manipulating device 50 is shown on axis, to a larger scale, in more detail, in FIG. 5.

The manipulating device 50 is used to manipulate the optical window 46 to refract the optical beams appropriately to displace their points of intersection with the receiver 42 i.e. to adjust the pixels which are activated, to effect microscanning.

The manipulating device 50 includes transducers operated as displacement generators 10 which, in this embodiment, are four in number and are arranged in regularly circumferentially spaced, radially oriented configuration around the frame 48. The frame 48 is connected by means of resilient connecting formations 52 at the four points in question, to the displacement generators 10, more specifically to the rigid connecting points 24 which undergo the transverse displacements when the respective stacks 14 are longitudinally deformed. The arrangement is such that deformation of the respective stacks 14 causes longitudinal displacement (i.e. longitudinal relative to the axis 45) of the connecting points to the frame 48. It is to be appreciated that the individual displacement generators can individually be controlled and that coordinated deformation of the respective stacks 14 can achieve the following basic movements in the optical window 46 and combinations thereof. Direction must be interpreted in relation to the optical axis 45.
  a) longitudinal movement to and fro;
  b) pivoting movement about an orthogonal axis through the optical window 46 where the orthogonal axis can be horizontal, or vertical, and intercepts the axis 45 of the optical system 44;
  c) pivoting about axes extending perpendicularly to the optical axis 45, tangentially to the frame 48 and respectively intercept the connections 52 between the respective displacement generator 10 and the frame 48.

It is to be appreciated that such controlled displacement can be obtained by appropriately controlling a generator of potential difference applied to the respective stacks of the respective displacement generators.

In another embodiment, if desired, the displacement generators may be re-oriented to achieve displacement in directions parallel to tangential directions. The manipulating device may then be used to achieve pivoting about the longitudinal axis.

By way of development, as can best be perceived when visualising the micro-scanning arrangement 40 as seen in FIG. 4, the two displacement generators 10 shown in the drawing are arranged in an opposing pair attached to the frame 48 and are oriented in mirror image fashion such that, for example, contraction of the stacks will displace the frame 48 at the respective connections 52 away from the receiver 42. The orientation of the displacement generators in the other pair (which is not shown) is opposite, i.e. such that elongation of their stacks will move their connections 52 with the frame 48 toward the receiver 42. Such opposite orientation will obviously be borne in mind in controlling the manipulating device 50. The reason for such orientation is that the respective rigid beams can be prestressed in tension to compress the respective stacks to ensure that the stacks operate exclusively in compression, or mostly in compression, which, as mentioned above, is regarded as desirous.

It is a first advantage of the invention that manipulating of the optical window 46 is effected by means of a plurality of piezoelectric stacks. It is to be appreciated that piezoelectric stacks can be deformed very easily by the application of appropriate electrical potential differences, that such application of electrical potential differences can be controlled very easily and very accurately, and furthermore that such displacement can be adjusted extremely fast, as is required for microscanning.

It is regarded as a very important advantage that the use of converse piezoelectric effect, with the accompanying advantages as briefly mentioned above, is made possible by a displacement generator in accordance with this invention which, in a very convenient, simple and elegant fashion, amplifies displacement of a piezoelectric stack.

It is yet further an advantage that the piezoelectric material undergoes substantially pure elongation/contraction as opposed to bending, and that the bending stress present in the component, occurs in the metal component. This is regarded as an advantage in that the integrity of piezoelectric (ceramic) material is much higher under pure elongation/contraction (especially elongation which causes compression, as mentioned herein) than under bending. Yet further, it is to be appreciated that the bending stress to which the metal component is subjected, can be catered for by appropriate design in respect of dimensions and shape of the metal component, and by appropriate selection of the kind of metal material. Naturally, if appropriate, material other than metal can be used instead.

What is claimed is:

1. A strain/electrical potential transducer including
   a rigid base,
   an elongate stack of dielectric substance having electrical contactors arranged to be subjected to an electric potential associated with electro-deformation of the dielectric substance, a first end of the elongate stack being hinged to the base at a stack hinge position;
   a rigid beam hinged at a first end thereof to the base at a beam hinge position, the rigid beam being transversely spaced from the elongate stack and extending generally longitudinally with the elongate stack;
   a rigid connecting link extending transversely between and interconnecting opposed ends respectively of the elongate stack opposite to said first, hinged end, and of the rigid beam opposite to said first, hinged end, the configuration being such that longitudinal deformation in the elongate stack and transverse displacement in said opposed end of the rigid beam are causally connected.

2. A strain/electrical potential transducer as claimed in claim 1 in which the elongate stack is of piezoelectric material.

3. A strain/electrical potential transducer as claimed in claim 1 which is arranged in a plane.

4. A strain/electrical potential transducer as claimed in claim 1 in which hinging is by means of solid hinge formations allowing hinging.

5. A strain/electrical potential transducer as claimed in claim 1 in which the hinges are articulated.

6. A strain/electrical potential transducer as claimed in claim 1 in which connection of the rigid connecting link to respectively the elongate stack and the rigid beam is with no lost motion.

7. A strain/electrical potential transducer as claimed in claim 1 which is of composite structure, said elongate stack and said rigid connecting link being respectively a first elongate stack and a first connecting link, the transducer including also a second elongate stack and a second rigid connecting link arranged in a fashion similar to and connected in a fashion similar to the first elongate stack and the first connecting link.

8. A strain/electrical potential transducer as claimed in claim 7 which includes a first sub-arrangement comprising the first elongate stack and the first rigid connecting link, and a second sub-arrangement comprising the second elongate stack and the second rigid connecting link, the first and second sub-arrangements being symmetric and sharing the rigid beam which is common to the first and second sub-arrangements.

9. A strain/electrical potential transducer as claimed in claim 8 in which the rigid beam is placed under tension to compress the first and second elongate stacks, such that, in use, tension in the elongate stacks is at least limited.

10. A strain/electrical potential transducer as claimed in claim 1 which is in the form of a displacement generator.

11. A strain/electrical potential transducer as claimed in claim 10 in which the or each elongate stack is a piezoelectric material adapted to produce a converse piezoelectric effect.

12. A strain/electrical potential transducer as claimed in claim 1 which is in the form of a displacement sensor.

13. A strain/electrical potential transducer as claimed in claim 12 in which the or each elongate stack is a piezoelectric material adapter to produce direct piezoelectric effect.

14. A composite strain/electrical potential transducer comprising a plurality of transducers as claimed in claim 1 which are combined to have a single displacement input/output and a single electrical potential input/output.

15. A manipulating device for use in an optical system, the manipulating device including
   a frame for holding an optical element;
   a plurality of displacement generators as claimed in claim 10 and which are operatively connected to the frame and having connecting means for operative connection to an anchor member such as selectively to generate displacement of the frame relative to the anchor member.

16. A manipulating device as claimed in claim 15 in which bases of the respective displacement generators are connected to the anchor member.

17. A manipulating device as claimed in claim 16 in which the anchor member forms bases for the displacement generators, the second end of the rigid beam of each displacement generator being connected to the frame.

18. A manipulating device as claimed in claim 15 in which the displacement generators are arranged symmetrically.

19. A manipulating device as claimed in claim 15 in which the displacement generators are arranged in a plane.

20. A manipulating device as claimed in claim 19 in which the frame is round, the displacement generators extending radially outwardly from the frame.

21. A manipulating device as claimed in claim 20 in which the displacement generators are arranged such that said relative displacement between the frame and each displacement generator is in a longitudinal direction relative to an axis of the optical element to be held in the frame.

22. A manipulating device as claimed in claim 21 in which the displacement generators are even in number and are arranged in opposed pairs, the displacement generators in each opposed pair being in the same orientation and in opposite orientation to another opposed pair, the displacement generators being prestressed to cause the displacement generators to operate at least mostly in compression, the prestressing load in one pair of displacement generators being balanced by the prestressing load in the other pair of displacement generators, the prestressing loads being transmitted to the frame, then the frame or the frame in combination with the optical element when in position being rigid such as to balance the prestressing loads.

23. The combination of a manipulating device as claimed in claim 15 in combination with a generator of electrical potential which is controllable selectively to generate fluctuating potential difference to drive the stacks.

24. The combination as claimed in claim 23 in which the generator of electrical potential is a solid state generator having a plurality of outputs corresponding to the plurality of displacement generators or pairs of displacement generators, the combination including software or logic to manage or control the generator of electrical potential.

25. A microscanning device including an optical receiver, an optical system directed at the optical receiver and a manipulating device as claimed in claim 15 in which an optical element is held in the frame to form part of the optical system, the manipulating device being operable selectively and fluctuatingly to refract optical beams projected via the optical system to effect microscanning.

26. A composite strain/electrical potential transducer which is of composite structure comprising a first simple strain/electrical potential transducer as claimed in any one of claim 1 to claim 6 inclusive and a second simple strain/electrical potential transducer as claimed in any one of claim 1 to claim 6 inclusive, the first and second simple transducers being arranged alongside each other in a common plane, the composite transducer comprising a displacement member hinged to respective rigid connecting links of the first and second simple transducers.

27. A composite strain/electrical potential transducer as claimed in claim 26 in which the first and second simple transducers are mirror images and are arranged as mirror images.

28. A composite strain/electrical potential transducer as claimed in claim 26 in which the first and second simple transducers have a common rigid base.

29. A composite strain/electrical potential transducer as claimed in claim 26 in which the displacement member is hinged via solid, elongate hinges extending in the direction of displacement and allowing displacement only in directions transverse to the displacement in the respective rigid beams.

* * * * *